United States Patent
Ochi et al.

(10) Patent No.: US 7,471,260 B2
(45) Date of Patent: Dec. 30, 2008

(54) SEMICONDUCTOR MEMORY MODULE HAVING BUILT-IN ANTENNA

(75) Inventors: Shozo Ochi, Osaka (JP); Norihito Tsukahara, Kyoto (JP); Kazuhiro Ikurumi, Osaka (JP); Hidenobu Nishikawa, Nara (JP); Masato Hirano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/793,301

(22) PCT Filed: Feb. 2, 2006

(86) PCT No.: PCT/JP2006/001732

§ 371 (c)(1),
(2), (4) Date: Jun. 19, 2007

(87) PCT Pub. No.: WO2006/085466

PCT Pub. Date: Aug. 17, 2006

(65) Prior Publication Data

US 2008/0111756 A1    May 15, 2008

(30) Foreign Application Priority Data

Feb. 14, 2005  (JP) .............................. 2005-035589

(51) Int. Cl.
*H01Q 1/36* (2006.01)
(52) U.S. Cl. ................................ 343/895; 343/700 MS
(58) Field of Classification Search ................. 343/895, 343/700 MS, 866, 867, 870, 788, 741, 742
See application file for complete search history.

(56) References Cited

U.S. PATENT DOCUMENTS

| 2005/0134463 A1* | 6/2005 | Yamazaki ................. 340/572.8 |
| 2007/0075837 A1* | 4/2007 | Tuttle et al. ................. 340/10.1 |
| 2007/0176298 A1* | 8/2007 | Osone et al. ................. 257/777 |
| 2007/0296037 A1* | 12/2007 | Dozen et al. ................. 257/350 |

FOREIGN PATENT DOCUMENTS

| JP | 10-013313 | 1/1998 |
| JP | 2000-235635 | 8/2000 |
| JP | 2001-195553 | 7/2001 |
| JP | 2001-351085 | 12/2001 |
| JP | 2001-352208 | 12/2001 |
| JP | 2002-091709 | 3/2002 |
| JP | 2002-246828 | 8/2002 |
| JP | 2003-109988 | 4/2003 |

* cited by examiner

*Primary Examiner*—HoangAnh T Le
(74) *Attorney, Agent, or Firm*—McDermott Will & Emery LLP

(57) ABSTRACT

A semiconductor memory module formed of a mounted module (12) having a semiconductor memory device (16) and a control semiconductor device (18), a circuit board (14) which contains connection terminal (20) coupled with the control semiconductor device (18) and disposed so that it is exposed from the surface of outer case (42), and an antenna connection terminal electrode (22) disposed in the inside of outer case (42); and an antenna module (24) having a sheet board (26) which includes an antenna (28) disposed on one of the surfaces in the neighborhood of the edge along the sides, a layer (30) of magnetic substance disposed on the other surface, and an antenna terminal electrode (38) disposed on the one or the other surface. The antenna module (24) is overlaid on the mounted module (12), and the antenna connection terminal electrode (22) is connected with the antenna terminal electrode (38).

11 Claims, 11 Drawing Sheets

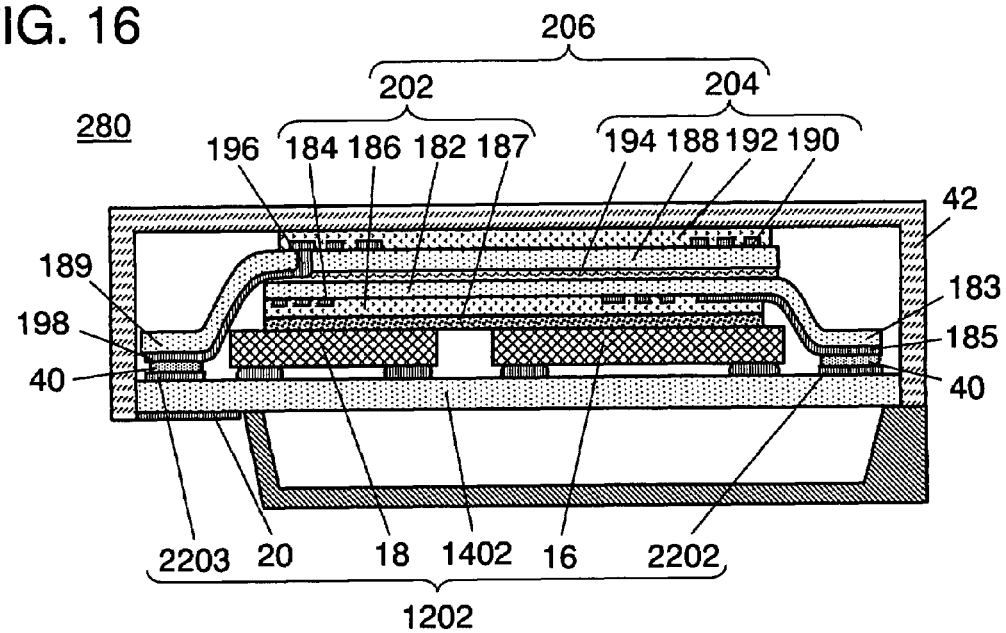
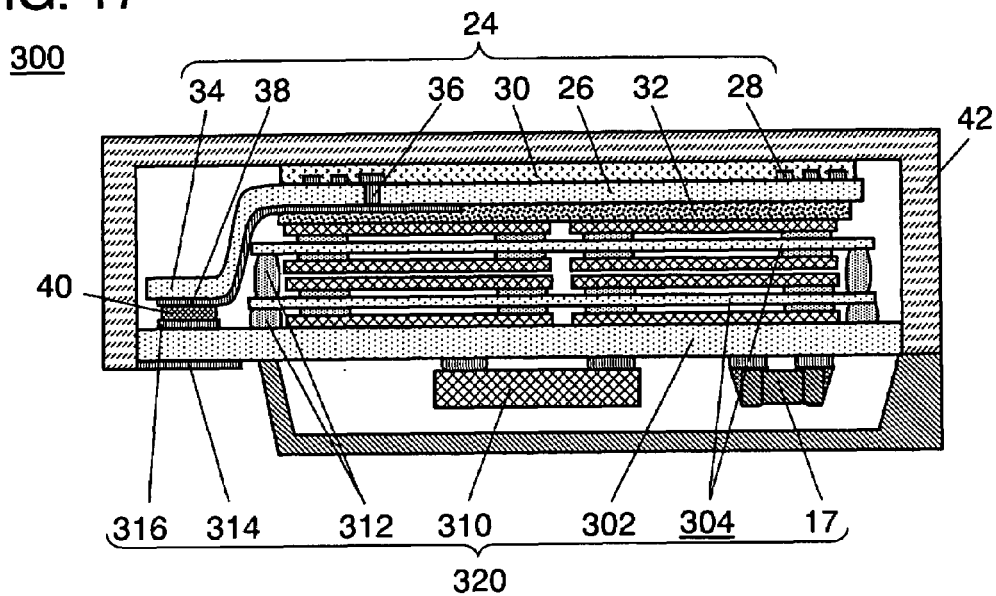

SEMICONDUCTOR MEMORY MODULE HAVING BUILT-IN ANTENNA

RELATED APPLICATIONS

This application is the U.S. National Phase under 35 U.S.C. § 371 of International Application No. PCT/JP2006/301 732, filed on Feb. 2, 2006, which in turn claims the benefit of Japanese Application No. 2005-035589, filed on Feb. 14, 2005, the disclosures of which Applications are incorporated by reference herein.

TECHNICAL FIELD

The present invention relates to a semiconductor memory module used as memory card, such as SD (Secure Digital) Memory Card, which contains built-in antenna.

BACKGROUND ART

Various types of large storage-capacity memory cards have become popular and used in many kinds of portable digital apparatus, such as digital cameras, portable music players, portable data terminals, etc. In order to promote such memory cards in more application fields, it is requested that these memory cards are equipped with a function of wireless communication.

Responding to such requests, Japanese Patent Unexamined Publication No. 2001-195553, for example, proposes a structure of adding a wireless interface function to an SD memory card.

FIG. 23 shows the structure as disclosed in the above Publication, while FIG. 24 shows its perspective view.

SD memory card 1410 has wireless control section 1430, in addition to memory section which performs the essential function as memory medium. Antenna module 1420 containing antenna 1450 is connected to wireless control section 1430 through connection section 1440. Flash memory 1460, which is the flash ROM for SD memory card 1410, stores also a driver program for operating the function of wireless communication. When SD memory card 1410 coupled with antenna module 1420 is attached to a portable digital apparatus or the like electronic equipment, it can communicate with the external apparatus through the wireless communicating function contained in SD memory card 1410, without the need of making any specific operation for that.

Besides the above, Japanese Patent Unexamined Publication No. 2002-91709 discloses another structure of adding a wireless interface function to an SD memory card.

The earlier-described Japanese Patent Unexamined Publication No. 2001-195553 discloses a structure of adding an antenna module to an SD memory card. This, however, is a structure in which an antenna module is added to an SD memory card at the end part. Namely, the antenna module is not housed within the SD memory card, but it is an attachment affixed from the outside to an SD memory card. As the result, the overall outer dimensions increase by the volume of the antenna module. This means that a host apparatus has to provide an extra space identical to the antenna module, if it uses such an SD memory card. This is an adverse factor against the ongoing downsizing efforts in the electronics industry. In order to evade the drawback, the Publication proposes other structure too; that is, SD memory card houses an antenna along the edge at a side which has no connection terminal. The proposed structure may work for the exemplified 2.4 GHz band, but the space available there may not be sufficient for the antenna length required for 13.56 MHz band, etc.

The present invention aims to solve the problems which arise when incorporating an antenna module in an SD memory card, etc. In other words, the present invention aims to implement a compact profile after the antenna function for wireless communication is incorporated; so that it can be housed in an SD memory card, for example, with which the dimensional specifications have been established. Thus a semiconductor memory module having built-in antenna in accordance with the present invention is provided with the functions of both the connection by contact and the non-contact communication.

SUMMARY OF THE INVENTION

A semiconductor memory module having built-in antenna in the present invention includes a mounted module which is formed of a circuit board having a connection terminal coupled with a control semiconductor device and disposed exposed from the surface of an outer case, an antenna connection terminal electrode coupled with the control semiconductor device and disposed in the inside of the outer case, and the semiconductor memory device and the control semiconductor device mounted on the circuit board; and an antenna module which is formed of an antenna of loop shape formed on one of the surfaces of a resin sheet board in the neighborhood of the edge along the sides, a layer of magnetic substance formed on the one or the other surface, and an antenna terminal electrode provided on the one or the other surface. The antenna module is overlaid on the mounted module with the layer of magnetic substance in between, and the antenna connection terminal electrode and the antenna terminal electrode are connected.

Since a very thin antenna module is overlaid on a mounted module with the antenna connection terminal and the antenna terminal electrode connected, a high-sensitivity antenna for wireless communication can be housed even in a semiconductor module which has an established dimensional specification, such as SD memory card. Structure of the present antenna module is suitable to volume production, and low cost. It would contribute to reduce cost of the semiconductor memory module having built-in antenna. So, large-volume data or confidential data may be transmitted by making use of the conventional connection terminal exposed from the outer case, while other data can be transmitted wireless via the antenna. Thus, a low cost semiconductor memory module having built-in antenna compatible with both the connection by contact and the non-contact system is made available in accordance with the present invention.

Since a layer of magnetic substance is disposed between the antenna module and the mounted module, sensitivity of the antenna is not ill-affected by an electromagnetic wave reflected from the mounted module, etc. So, a stable performance can be expected and the communication is ensured for a certain specific distance. As to material for the layer of magnetic substance, a resin paste which contains particles of ferrite or the like magnetic oxide is preferred to be used for printing. Also a resin paste containing particles of iron, cobalt or the like magnetic metal may be used instead.

In a mounted module of the above-described structure, a circuit board may be mounted with both semiconductor memory device and control semiconductor device on one of the surfaces. By so mounting, an antenna module can be affixed close to the other surface of circuit board at which there is neither semiconductor memory device nor control semiconductor device. Therefore, antenna module can be housed within a certain limited thickness of established specification.

Furthermore, in a mounted module of the above-described structure, a semiconductor memory device may be mounted on one of the surfaces of the circuit board, while a control semiconductor device on the other surface. In this case, the semiconductor memory device may be mounted laminated on one of the surfaces. Still further, a sub-board mounted with semiconductor memory device may be mounted laminated on the circuit board.

In the above-described structure, a number of semiconductor memory devices can be mounted on one of the surfaces of circuit board providing a large-capacity memory, while the antenna module can be mounted laminated. If an antenna module having a flexible property is overlaid on either one of the surfaces of mounted module, the total thickness hardly increases. In order to restrict the total thickness to be within a certain specific value, thickness of the mounted module and thickness of the antenna module may be determined respectively so as total of the two values falls within a rated range. It is easy to design and set the thickness values as such.

Still further, in an antenna module of the above-described structure, antenna of loop shape may be formed on both surfaces of a sheet board, connected to an antenna connection terminal electrode provided on the one or the other surface of the sheet board through a via electrode, and a layer of magnetic substance may be formed on the loop antenna at the one or the other surface.

By so structuring, a loop antenna is formed over the both surfaces of a sheet board to constitute an antenna module. This contributes making it still thinner. Furthermore, the antennas at respective surfaces can be connected easily either in series or in parallel by means of a via electrode and a circuit pattern of the sheet board.

Still further, in an antenna module of the above-described structure, a sheet board having the loop antenna and the layer of magnetic substance may be provided with an opening which is larger than the size of a control semiconductor device, and the antenna module may be overlaid on circuit board of mounted module so as the opening is shared by the control semiconductor device.

By so structuring, antenna module can be affixed close to the other surface of circuit board at which a control semiconductor device is mounted. In the present structure, the sheet board of antenna module has an opening and the control semiconductor device occupies the opening, and the loop antenna is in an outer region surrounding the opening. So, if thickness of an antenna module is made to be substantially identical with that of the control semiconductor device, inclusion of the antenna module would not cause an increased overall thickness.

Still further, an antenna module of the above-described structure may be provided by laminating a first antenna module having a first antenna formed in loop shape on one of the surfaces of a first sheet board and a second antenna module having a second antenna formed in loop shape on one of the surfaces of a second sheet board, and a layer of magnetic substance may be formed on either the first or the second sheet board.

By so structuring, the first and the second antennas can be connected in series to obtain a certain specific antenna length. Or, the antennas can be connected in parallel to raise the antenna sensitivity. Furthermore, it can be adapted to a certain specific working frequency by setting the coiling diameter and the number of coiling turns of the loop antenna at appropriate values.

Still further, in the above-described structure, a common antenna terminal electrode connected with first antenna terminal electrode of first antenna module and second antenna terminal electrode of second antenna module may be connected to antenna connection terminal electrode of a mounted module.

By so structuring, a first antenna terminal electrode and a second antenna terminal electrode may be connected beforehand, and then connected with an antenna connection terminal provided on the mounted module's circuit board. This contributes to simplify the processes of assembly and mounting. Number of terminals to be connected with circuit board of mounted module can be reduced, which leads to simplification of the structure of a circuit board.

Still further, in the above-described structure, a first antenna terminal electrode of first antenna module and a second antenna terminal electrode of second antenna module may be connected respectively with mounted module's antenna connection terminal electrode.

By so structuring, the first antenna module and the second antenna module can be connected individually to antenna connection terminal disposed on the circuit board of mounted module. For example, even if an antenna connection terminal for connection with first antenna module and an antenna connection terminal for connection with second antenna module are disposed at places opposing to each other, the mounting can be done with ease. This helps making the circuit design of a circuit board easier.

Still further, in the above-described structure, the antenna module may be provided for two, with each surface of mounted module overlaid by one antenna module. This configuration alleviates the fluctuation of sensitivity due to relative direction of the semiconductor memory module with respect to an external apparatus. This makes the semiconductor memory module having built-in antenna user-friendly.

As described in the above, the present invention helps making a high sensitivity antenna for wireless communication to be suitable for a built-in use, and implements it in a slim contour. As the result, the antenna can be housed even in an SD memory card, the shape and dimensions of which have strictly been established. Thus the present invention recites a substantial advantage that a large memory-capacity semiconductor memory module having built-in antenna is provided with function of both the connection by contact and the no-contact wireless communication.

BRIEF DESCRIPTION OF THE DRAWINGS

FIG. 16 is a cross section view used to describe the structure of a second modification of SD memory card in the fifth embodiment.

FIG. 17 is a cross sectional view used to describe the structure of an SD memory card in a sixth exemplary embodiment of the present invention.

FIG. 18 is a cross sectional view used to describe the structure of a sub-board in the sixth embodiment.

Figure 1:
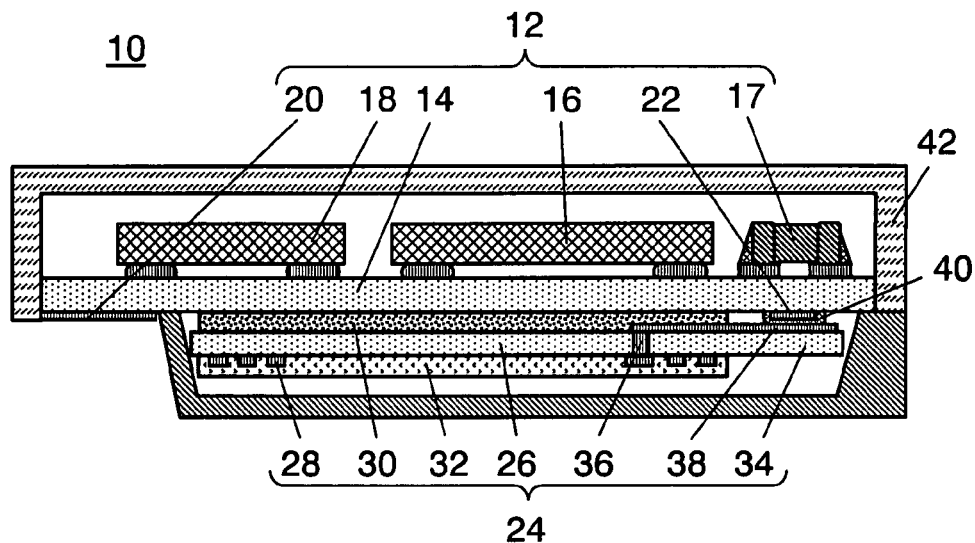
FIG. 1 shows a cross sectional view of an SD memory card in accordance with a first exemplary embodiment of the present invention.

REFERENCE MARKS IN THE DRAWINGS 10, 46, 90, 160, 180, 210, 220, 250, 260, 280, 300, 350, 1250, 1280, 1410 SD Memory Card (Semiconductor Memory Module having Built-in Antenna)
12, 320, 1201, 1202 Mounted Module
14, 302, 1401, 1402 Circuit Board
16, 308 Semiconductor Memory Device
17 Capacitor
18, 310 Control Semiconductor Device
20, 314 Connection Terminal
22, 316, 2201, 2202, 2203, 2204 Antenna Connection Terminal (Antenna Connection Terminal Electrode)
24, 48, 120, 158, 206, 244, 340, 1420 Antenna Module
26, 222, 322 Sheet Board
28, 324, 1450 Antenna
30, 55, 97, 128, 187, 228, 328 Layer of Magnetic Substance
32, 54, 68, 96, 108, 126, 146, 186, 192, 226, 232, 326 Insulating Protection Layer
34, 62, 76, 183, 189 Extension
36, 58, 60, 74, 100, 102, 111, 112, 134, 152, 196, 200, 201, 234, 240, 330 Via Electrode
38, 185, 198, 242, 332 Antenna Terminal Electrode
40 Conductive Glue
42 Outer Case
50, 92, 122, 182 First Sheet Board
52, 94, 124, 184, 224 First Antenna
56, 98, 130 Common Terminal (Common Antenna Terminal Electrode)
63, 132 First Connection Electrode
64, 104, 140, 188 Second Sheet Board
66, 106, 142, 190, 230 Second Antenna
70, 110, 148, 194 Gluing Layer
72 Second Antenna Terminal Electrode
80, 116, 154, 202 First Antenna Module
82, 118, 156, 204 Second Antenna Module
150 Second Connection Electrode
238 Connection Electrode
304 Sub-Board
306 Auxiliary Circuit Board
312 Conductive Connector
1430 Wireless Control Section
1440 Connection Section
1460 Flash Memory

DETAILED DESCRITPTION OF PREFERRED EMBODIMENTS

Exemplary embodiments of the present invention will be described with reference to the drawings. In the drawings, dimensions are illustrated enlarged in the direction of thickness for easier understanding of the structure. Those elements identical to each other are marked with identical indications, and description on such portion would sometimes be eliminated. In the following embodiments, description will be made on the examples where the present invention is applied to an SD memory card. So, the semiconductor memory module having built-in antenna will be referred to as SD memory card.

First Exemplary Embodiment

Figure 2:
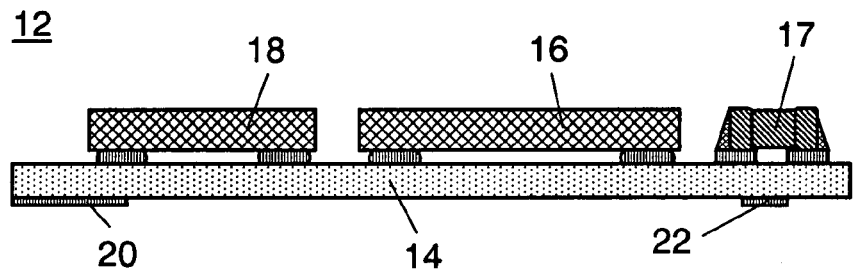
FIG. 2 shows a cross sectional view of the mounted module, being one of the principal constituents, in the first embodiment.
Figure 3:
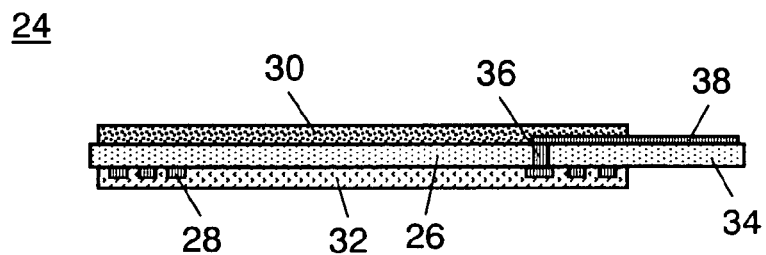
FIG. 3 shows a cross sectional view of antenna module, being one of the principal constituents, in the first embodiment.

FIG. 1 shows a cross sectional view of SD memory card 10 in a first exemplary embodiment of the present invention. FIG. 2 shows a cross sectional view of mounted module 12, which is one of the principal constituents, while FIG. 3 shows a cross sectional view of antenna module 24, which is one of the principal constituents, too. An SD memory card in the present embodiment is provided with the function of connection by contact and the information transmitting through non-contact system.

As shown in FIG. 1, SD memory card 10 in the present embodiment is made of mounted module 12 and antenna module 24 overlaid together, antenna connection terminal electrode (hereinafter referred to as antenna connection terminal) 22 is connected with antenna terminal electrode 38, and then these are housed in outer case 42. Connection terminal 20 which is formed on circuit board 14 of mounted module 12 is exposed at the surface of outer case 42. When SD memory card 10 is inserted in an external apparatus (not shown), connection terminal 20 gets into contact with a terminal of the external apparatus (not shown) accomplishing the mutual electrical connection.

Mounted module 12 is circuit board 14 made of e.g. glass epoxy resin board of approximately 100 μm thick mounted at one of the surfaces with semiconductor memory device 16, control semiconductor device 18 of 50-100 μm thick and capacitor for noise-cancellation 17, etc., for example. At one end of circuit board 14, a certain specific number of connection terminals 20 are provided on the other surface. These connection terminals 20 are disposed in a manner so as they are exposed from outer case 42, as shown in FIG. 1. Also provided on circuit board 14 at the other end is antenna connection terminal 22, which is connected with antenna terminal electrode 38 of antenna module 24.

Connection terminal 20 and antenna connection terminal 22 are connected, respectively, with certain specific terminals (not shown) of control semiconductor device 18. Semiconductor memory device 16 and control semiconductor device 18 are coupled by way of circuit electrodes which are not shown in the drawing. Circuit board 14 is further provided with a via conductor for connection between a circuit electrode formed on the one surface at which semiconductor memory device 16, etc. are mounted and a circuit electrode formed on the other surface at which connection terminal 20, and other items. However, they are not shown in the drawings. Connection terminal 20, circuit electrode, via conductor, etc. can be formed by processing a copper foil or the like metal foil, or a conductive resin to a certain specific pattern. Semiconductor memory device 16 and control semiconductor device 18 can be mounted on circuit board 14 by using any one of known methods, such as connection with solder bump, gold bump, conductive glue method, etc.

Control semiconductor device 18 controls semiconductor memory device 16 and incoming information from an external apparatus (not shown). The information incoming from external apparatus can be that which is conveyed by electrical signal through connection terminal 20 or that which is conveyed through electromagnetic wave transmitted/received through antenna module 24.

Figure 4:
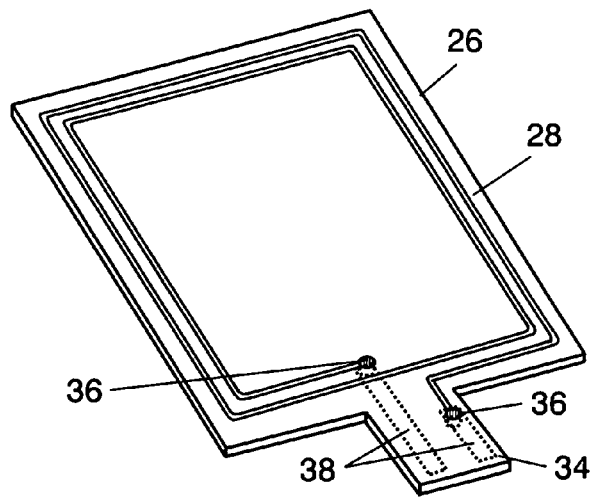
FIG. 4 is a perspective view showing the outline of an antenna module in the first embodiment, as viewed from the antenna side.

FIG. 4 is a perspective view which shows the outline of antenna module 24 as viewed from the antenna 28 side. In the present embodiment, there is insulating protection layer 32 formed on the surface of antenna 28; however, for the sake of easier understanding, the layer does not appear in FIG. 4. In the following, the structure of antenna module 24 is described referring to FIGS. 1, 3 and 4. Antenna module 24 includes sheet board 26, and loop antenna 28, insulating protection layer 32 for protecting antenna 28, which are formed on one of the surfaces of the sheet board, and layer 30 of magnetic substance, antenna terminal electrode 38 which are formed on the other surface, and via electrode 36 for connecting antenna 28 with antenna terminal electrode 38.

Sheet board 26 is a resin sheet of 50-100 μm thick, made of polyethylene terephthalate or the like material. Sheet board 26 has extension 34 at its one end for disposing antenna terminal electrode 38, as shown in FIG. 4. Antenna 28 of large loop shape is provided in the neighborhood of the edge along the sides of sheet board 26 on one of the surfaces. The antenna has been formed by printing a silver paste, for example, for approximately 10 μm thick. The end of antenna 28 is brought to extension 34 by way of via electrode 36 provided in sheet board 26, and connected with antenna terminal electrode 38. Those antenna 28, antenna terminal electrode 38 and via electrode 36 may be formed with the same conductive resin paste, or the respective items may be formed with different materials.

Provided on the other surface of sheet board 26 is layer 30 of magnetic substance, which layer is formed to be slightly larger than the outer size of antenna 28. Layer 30 of magnetic substance is formed by printing a paste of magnetic substance, e.g. a mixture of powdered ferrite and epoxy resin, for a thickness of 10-50 μm. Or, a ferrite or the like ceramic sheet may be affixed instead. The surface of antenna 28 is printed with insulating protection layer 32 of 10 μm thick. This layer is aimed for protecting conductor pattern of antenna 28 from a mechanical damage; it may be eliminated if antenna 28 can be mounted without undergoing such a risk.

Now, a method of mounting and assembling SD memory card 10 is described referring to FIG. 1. Overlay, as shown in FIG. 1, the above-configured assembled module 12 and antenna module 24, and then connect circuit board 14's antenna connection terminal 22 with sheet board 26's antenna terminal electrode 38 using conductive glue 40, for example. The connecting may be made instead by soldering. After they are connected, information received at antenna 28 is inputted to control semiconductor device 18, and information outputted from control semiconductor device 18 can be transmitted to an external apparatus through antenna 28.

In fitting it in the inside of outer case 42, connection terminal 20 has to be located at a specified place so that the terminal is exposed from outer case 42. SD memory card 10 in the present embodiment is thus fabricated.

SD memory card 10 in the present embodiment is compact enough to be housed in a limited space, 24 mm×32 mm×2.1 mm, specified for an SD memory card. The present memory card can provide superior performance as compared to conventional cards; it can exchange information with an external apparatus either through the contact method or the non-contact system. Furthermore, since it has layer 30 of magnetic substance disposed between mounted module 12 and antenna module 24, possible influence of electromagnetic wave reflected from circuit board 14, semiconductor memory device 16, control semiconductor device 18, etc. can be sufficiently suppressed; it helps realizing a high-sensitivity transmission/reception.

Semiconductor memory device 16 and control semiconductor device 18 mounted on circuit board 14 of mounted module 12 may be either a package-type or a bare-chip type. Or, as described later, a sub-board mounted with bare-chip semiconductor device may be mounted.

Second Exemplary Embodiment

Figure 5:
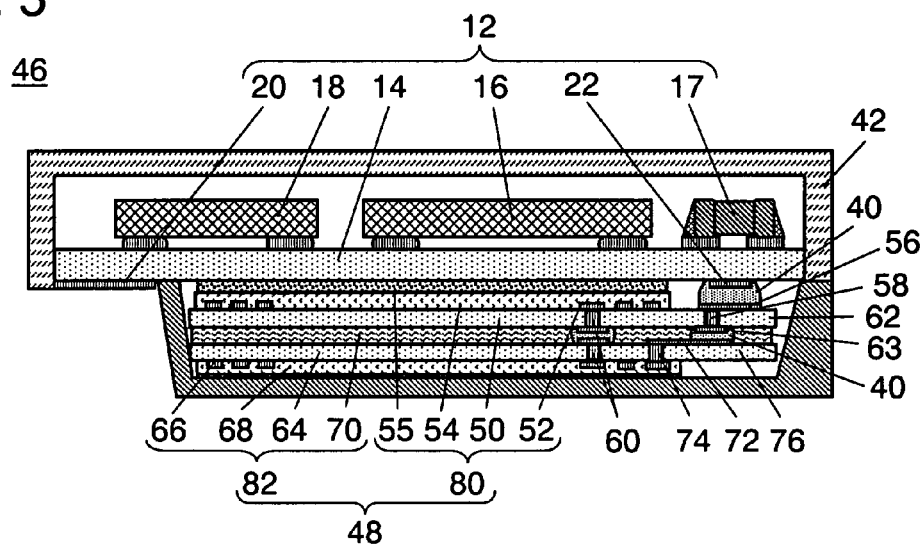
FIG. 5 shows a cross sectional view of an SD memory card in accordance with a second exemplary embodiment of the present invention.

FIG. 5 shows a cross sectional view of SD memory card 46 in a second exemplary embodiment of the present invention. The difference of SD memory card 46 in the present embodiment as compared with SD memory card 10 of the first embodiment is in the structure of antenna module 48, as seen in FIG. 5.

Figure 6:
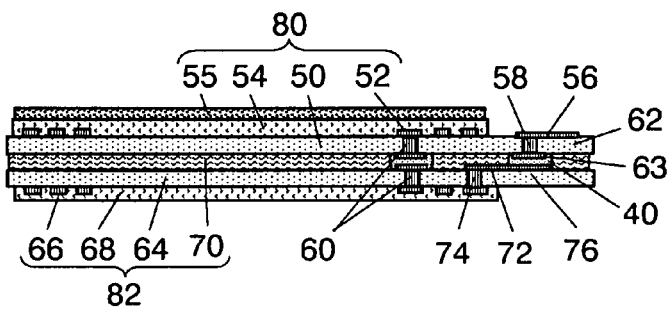
FIG. 6 is a cross sectional view showing the outline structure of an antenna module in the second embodiment.
Figure 7A:
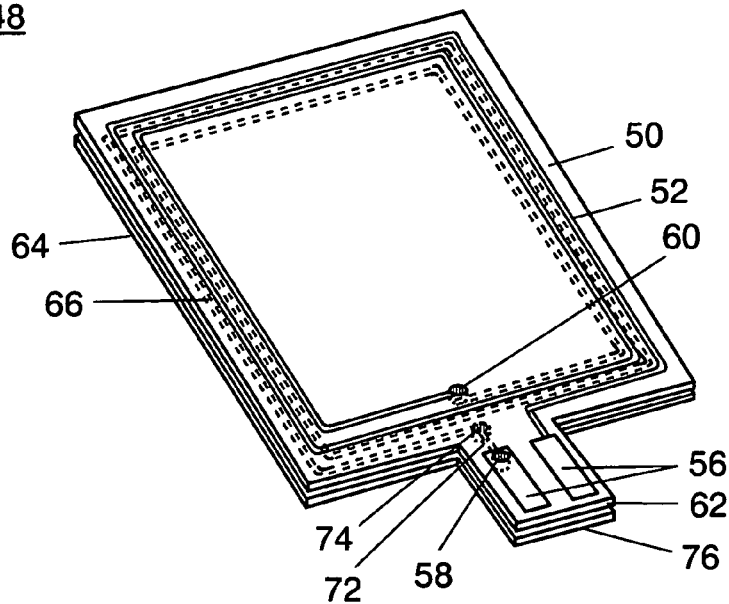
FIG. 7A is a perspective view showing the outline of an antenna module in the second embodiment.
Figure 7B:
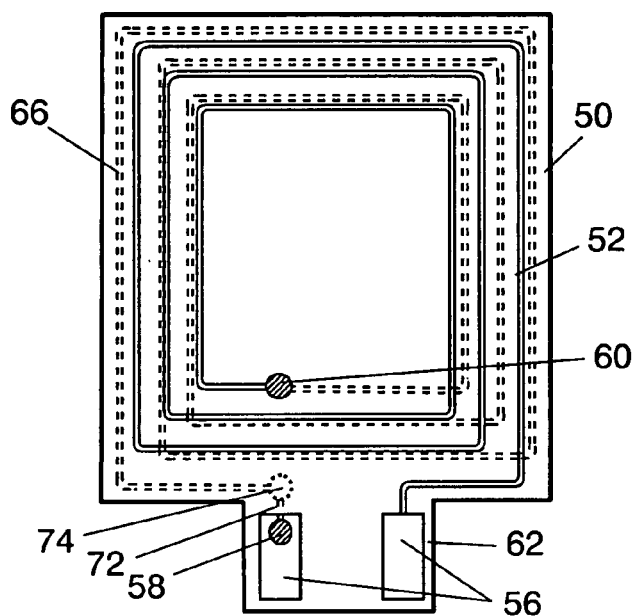
FIG. 7B is a plan view showing a typified antenna module in the second embodiment, as viewed from the first antenna module side.

Antenna module 48 contained in the present SD memory card 46 is formed of a first antenna module 80 and a second antenna module 82 united overlaid. FIG. 6 is a cross sectional view showing the outline structure of antenna module 48. FIG. 7A is a perspective view which shows the outline of antenna module 48, while FIG. 7B is a typified plan view as viewed from the first antenna module 80 side. In FIG. 7A and 7B, insulating protection layer 54 formed on first antenna 52 of first antenna module 80 and layer 55 of magnetic substance are eliminated for the sake of easier understanding of the drawings.

In antenna module 48, first antenna module 80 and second antenna module 82 are laminated. Described in the present embodiment is an example where first antenna 52 of first antenna module 80 and second antenna 66 of second antenna module 82 are connected in series, and then connected to antenna connection terminal 22 of circuit board 14.

First antenna module 80 includes first sheet board 50 having first loop antenna 52 formed in the neighborhood of the edge along the sides on one of the surfaces of first sheet board 50, and insulating protection layer 54 formed on the surface. First sheet board 50 is provided with extension 62 like the case of antenna module 24 in the first embodiment. On one surface of extension 62, common antenna terminal electrode (common terminal) 56 is provided. On the other surface, first connection electrode 63 is provided for connection with second antenna terminal electrode 72 of second antenna module 82. Layer 55 of magnetic substance is further formed on insulating protection layer 54.

The shape of second antenna module 82 is basically the same as first antenna module 80. Second sheet board 64 has gluing layer 70 provided on one of the surfaces, while on the other surface, second antenna 66 and insulating protection layer 68 covering its surface.

First antenna module 80 and second antenna module 82 are united with second antenna module 82's gluing layer 70 in between. First connection electrode 63 of first antenna module 80 is connected with second antenna terminal electrode 72 of second antenna module 82 using, for example, conductive glue 40. This completes antenna module 48.

One end of first antenna 52 of first antenna module 80 is connected to one of the above-described common terminals 56, while the other end is brought to the other surface of first sheet board 50 through via electrode 60, for connection there with one end of second antenna 66 of second antenna module 82.

Second antenna 66 is wound in the same winding direction as first antenna 52, and then brought to the other surface of second sheet board 64 through via electrode 74 provided at second sheet board 64's extension 76 or the vicinity, for connection with first connection electrode 63 provided at the other surface of first sheet board 50. First connection electrode 63 is brought to the one surface of first sheet board 50 through via electrode 58, for connection there with the other common terminal 56. Thus, first antenna 52 and second antenna 66 are connected in series, and respective ends are connected with common terminal 56.

After antenna module 48 is thus provided, it is affixed and laminated to mounted module 12 with first antenna module 80's layer 55 of magnetic substance at the mounted module 12 side. And then, antenna connection terminal 22 of mounted module 12 and common terminal 56 of antenna module 48 are connected with conductive glue 40, for example.

And then, mounted module 12 and antenna module 48 are housed in a specified place of outer case 42 so that mounted module 12's connection terminal 20 is exposed from outer case 42 to the outside. SD memory card 46 in the present embodiment is thus fabricated.

Descriptions in the present embodiment have been made on an example where first antenna 52 and second antenna 66 are connected in series and then connected to circuit board 14's antenna connection terminal 22. However, the first and the second antennas can be connected instead in parallel. For the parallel connection, common terminal 56 of antenna module 48 may be provided for two from each of first antenna 52 and second antenna 66, totaling four, and connected respectively with corresponding antenna connection terminals 22 of circuit electrode. Instead, the parallel connection may be provided beforehand at first sheet board 50's extension 62 and second sheet board 64's extension 76 by means of via electrode, and the connection with antenna connection terminal 22 of circuit board 14 done only at two points.

Although layer 55 of magnetic substance in the present embodiment has been formed on insulating protection layer 54 of first antenna module 80, the layer can be formed instead on the other surface of first sheet board 50 if the pattern of first antenna module 80's first antenna 52 and the structure of via electrode are modified.

As described in the above, in SD memory card 46 in the present embodiment, first antenna module 80 and second antenna module 82 are first connected and integrated into a single body and then it is connected to mounted module 12. In this configuration, if first antenna 52 and second antenna 66 are connected in series the antenna length can be made longer and the number of turns increased; so, the antenna sensitivity can be raised. If connected in parallel, the antenna resistance can be lowered even when a conductive resin paste of relatively high resistance is used, and the antenna sensitivity can be raised.

Figure 8:
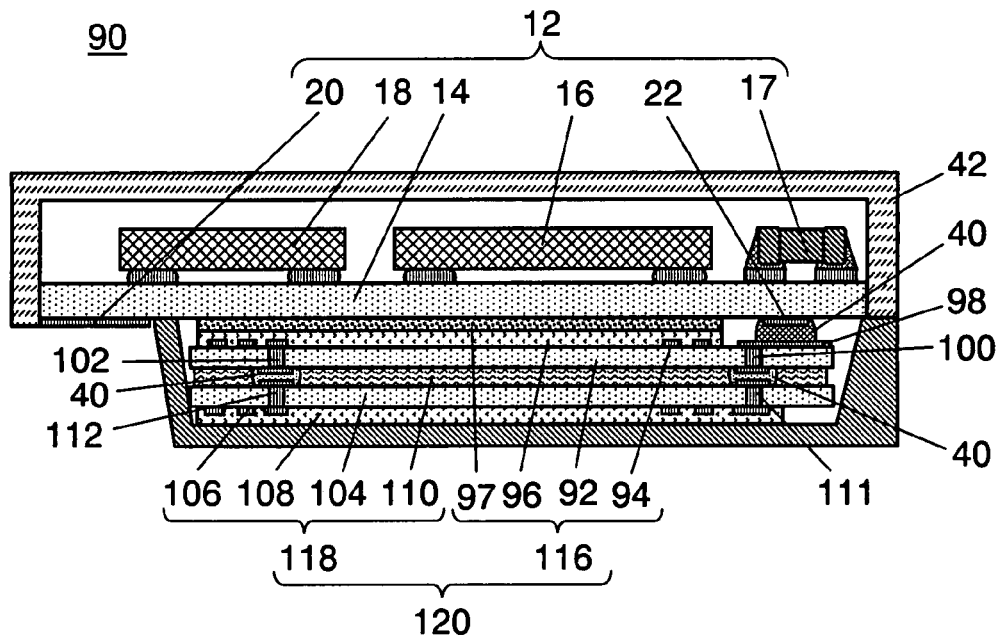
FIG. 8 is a cross sectional view used to describe the structure of a first modification of SD memory card in the second embodiment.

FIG. 8 is a cross sectional view used to describe the structure of a first modification of the present embodiment, SD memory card 90. Description is made, also in the present modification, on an example where antenna module 120 is provided by laminating first antenna module 116 with second antenna module 118, first antenna 94 and second antenna 106 are connected in series. Antenna module 120 in SD memory card 90, or the first modification, disposes a region for connecting first antenna 94 and second antenna 106, and a place of common terminal 98 for connection with antenna connection terminal 22 of circuit board 14 at separate locations.

Namely, in first antenna module 116, first loop antenna 94 is formed at the neighborhood of the edge along the sides of first sheet board 92 on one of the surfaces, and insulating protection layer 96 on the surface. Provided further on the surface of the layer is layer 97 of magnetic substance. At an end of first sheet board 92, common terminal 98 is provided for connection with circuit board 14's antenna connection terminal 22. One end of first antenna 94 is connected at one end with one of common terminals 98.

Second antenna module 118 is shaped the same as first antenna module 116. Gluing layer 110 is formed on one of the surfaces of second sheet board 104, while second antenna 106 on the other surface. Insulating protection layer 108 is formed on the surface of second antenna.

Now the structure of antenna module 120 is described below. Antenna module 120 is formed by laminating and gluing first antenna module 116 and second antenna module 118, with second antenna module 118's gluing layer 110 in between. When, the other end of first antenna 94 and one end of second antenna 106 are connected by means of via electrodes 102, 112. The practical connection process is connecting connection electrodes, which have been provided at the respective reverse surfaces, with conductive glue 40, for example. The other end of second antenna 106 is connected with the other common terminal 98 by means of via electrodes 100, 111 provided in the neighborhood of common terminal 98. First antenna 94 and second antenna 106 are thus connected in series, and eventually connected with common terminal 98. Via electrodes 100, 102, 111 and 112 are provided at their respective ends with connection electrodes, as illustrated.

Antenna module 120 thus structured is affixed to circuit board 14 with the surface having layer 97 of magnetic substance faced to the circuit board, and common terminal 98 and antenna connection terminal 22 are connected by means of conductive glue 40, for example. SD memory card 90, or a first modification, is thus fabricated.

Although SD memory card 90 has been described using an example where first antenna 94 and second antenna 106 are connected in series, the antennas can be connected instead in parallel. Although layer 97 of magnetic substance has been provided on insulating protection layer 96 of first antenna module 116 also in the present first modification, the layer can be formed instead on the other surface of first sheet board 92 if the pattern of first antenna module 116's first antenna 94 and the structure of via electrode are changed.

The above-configured SD memory card 90 exhibits a high antenna-sensitivity and capable of transmitting/receiving information through the non-contact system or the contact method. The memory card can be fabricated in conformity with the design specifications as an SD memory card.

Figure 9:
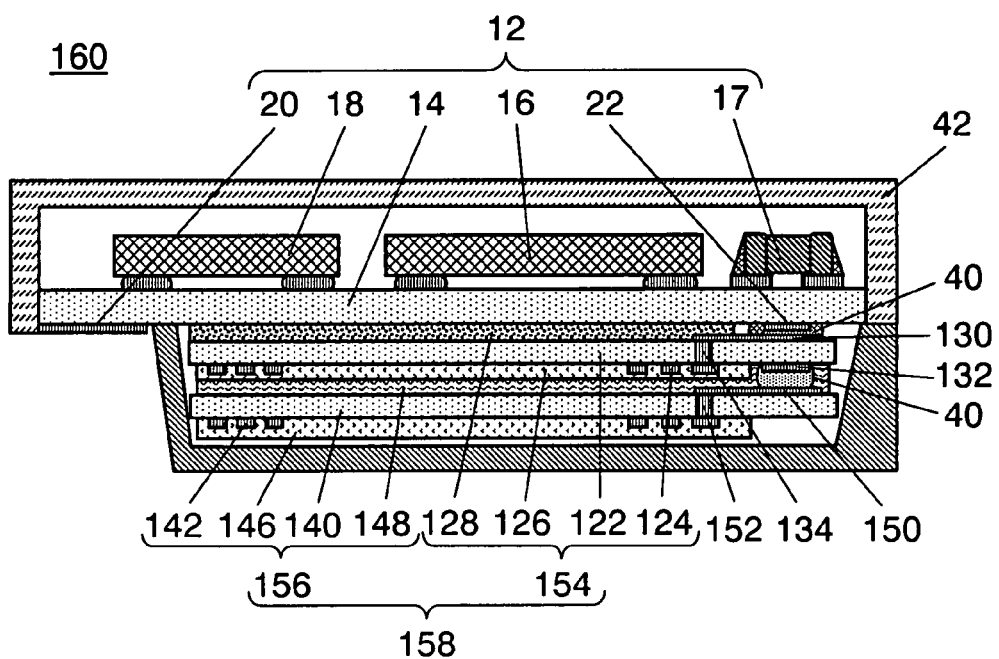
FIG. 9 is a cross sectional view used to describe the structure of a second modification of SD memory card in the second embodiment.

FIG. 9 is a cross sectional view used to describe the structure of a second modification of the present embodiment, SD memory card 160. The point of difference from SD memory card 46 is in the structure of antenna module 158, also in the present case of SD memory card 160.

In antenna module 158 of SD memory card 160, or a second modification, first antenna module 154 and second antenna module 156 have almost identical shapes. However, layer 128 of magnetic substance is provided only to first antenna module 154. First antenna 124 and second antenna 142 are connected in parallel, and connected to antenna connection terminal 22 by means of common terminal 130.

In first antenna module 154, first loop antenna 124 is formed in the neighborhood of the edge along the sides on one of the surfaces of first sheet board 122, and insulating protection layer 126 on the surface of antenna. Provided at an end of first sheet board 122 is common terminal 130, which terminal is for connection with circuit board 14's antenna connection terminal 22. On the other surface, first connection electrode 132 is provided in the neighborhood of common terminal 130. One end and the other end of first antenna 124 are brought to the other surface by means of via electrode 134 and connected respectively with common terminal 130. Layer 128 of magnetic substance is formed on the other surface.

Second antenna module 156 is shaped substantially the same as first antenna module 154. On one of the surfaces of second sheet board 140, second antenna 142 and insulating protection layer 146 are formed, while gluing layer 148 is provided on the other surface. Also in second antenna module 156, one end and the other end of second antenna 142 are brought to the other surface by means of via electrode 152, and connected respectively with second connection electrodes 150 which have been provided on the other surface. Second connection electrode 150 is connected with first connection electrode 132 by conductive glue 40, for example. These are connected further to respective common terminals 130 through via electrodes (not shown).

As shown in FIG. 9, first antenna module 154 and second antenna module 156 are laminated with the other surfaces of them faced to circuit board 14, antenna module 158 is thus provided. Common terminal 130 of antenna module 158 is connected with antenna connection terminal 22 of circuit board 14 by conductive glue 40, for example. This completes a structure where first antenna 124 and second antenna 142 are connected in parallel and connected to antenna connection terminal 22 of circuit board 14.

Although in SD memory card 160, or a second modification, ends of first antenna 124 and second antenna 142 are connected beforehand on first sheet board 122, the present invention is not limited to this arrangement. It may take other arrangement; for example, providing an extension to first sheet board 122 and second sheet board 140 respectively so as the two extensions are not disposed overlapped, and connect antenna terminal electrode and antenna connection terminal provided on the respective extensions with circuit board 14's antenna connection terminal 22. Circuit board 14 in the example requires antenna connection terminal 22 for four pieces. However, it is easy to provide four such terminals on circuit board 14.

Furthermore, the antennas may be connected in series, like in SD memory card 46 of the present embodiment.

The above-configured SD memory card 160 also exhibits a high antenna-sensitivity and capable of transmitting/receiving information through the non-contact system or the contact method. The memory card can be fabricated in conformity with the design specifications as an SD memory card.

Third Exemplary Embodiment

Figure 10:
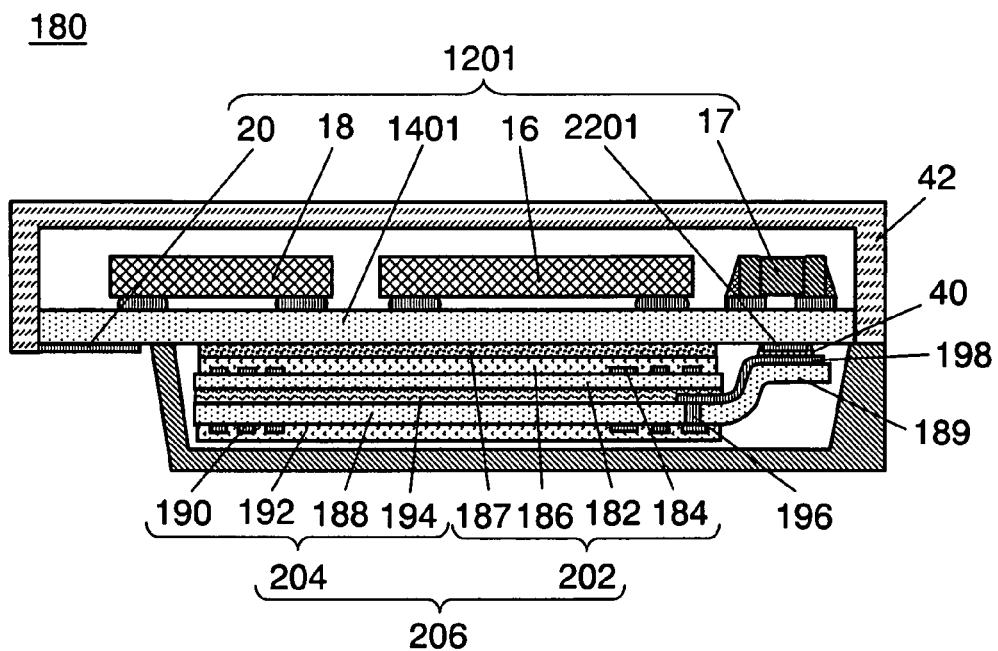
FIG. 10 is a cross sectional view used to describe the structure of an SD memory card in a third exemplary embodiment of the present invention.

FIG. 10 is a cross sectional view used to describe the structure of SD memory card 180 in a third exemplary embodiment of the present invention. In SD memory card 180 in the present embodiment, first antenna module 202 and second antenna module 204, which form antenna module 206, are connected individually to antenna connection terminal 2201 of circuit board 1401.

Circuit board 1401 of mounted module 1201 is mounted with semiconductor memory device 16 and control semiconductor device 18 on one of the surfaces, and connection terminal 20 is provided at an end of the other surface. At the other end of the other surface, antenna connection terminal 2201 is provided for connecting with respective antenna terminal electrodes 185, 198 of first antenna module 202 and second antenna module 204.

Figure 11:
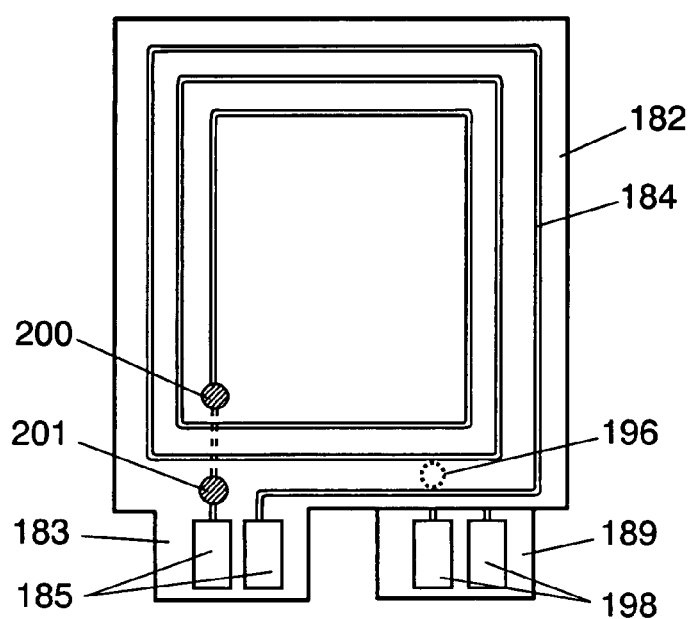
FIG. 11 is a plan view showing a typified antenna module in the third embodiment, as viewed from the first antenna module side.

FIG. 11 is a plan view showing typified antenna module 206 as viewed from the first antenna module 202 side. Insulating protection layer 186 and layer 187 of magnetic substance formed on first antenna 184 of first antenna module are not shown in FIG. 11.

First antenna module 202 and second antenna module 204 in the present embodiment are shaped substantially the same, with the exception of their extensions 183, 189. Namely, first sheet board 182 of first antenna module 202 is provided with first antenna 184 formed on one of the surfaces, and insulating protection layer 186 for protecting first antenna 184 and layer 187 of magnetic substance formed on insulating protection layer 186. One end of first antenna 184 is connected with antenna terminal electrode 185 provided at extension 183, while the other end is brought to the other surface by means of via electrode 200 to be connected to other antenna terminal electrode 185 by way of a circuit electrode (not shown) formed on the other surface and via electrode 201.

Second antenna module 204 includes second antenna 190 formed on one of the surfaces of second sheet board 188 and insulating protection layer 192 for protecting second antenna 190, and gluing layer 194 formed on the other surface. One end of second antenna 190 is connected with antenna terminal electrode 198 provided at extension 189, while the other end is brought to the other surface through a via electrode (not shown) to be connected to other antenna terminal electrode 198 by way of a circuit electrode (not shown) provided on the other surface and via electrode 196. Second antenna 190 has the same structure as first antenna 184.

The above-configured first antenna module 202 and second antenna module 204 are glued together by gluing layer 194. And then, these are affixed close to circuit board 1401, and respective antenna terminal electrodes 185, 198 are connected to antenna connection terminal 2201 by conductive glue 40, for example. SD memory card 180 in the present embodiment is thus fabricated. Extension 189 of second antenna module 204 has to be bent as shown in the drawing so that it can make a close contact with circuit board 1401. Since second sheet board 188 has a flexible property, it is easy to bend the board as such.

In this example, first antenna module 202 and second antenna module 204 have been simply laminated; they need not be connected electrically. This makes fabrication of antenna module 206 easier. Furthermore, whether to connect first antenna 184 and second antenna 190 in series or in parallel can be determined freely by changing the design of a circuit electrode accordingly, which circuit electrode is connecting antenna connection terminal 2201 of circuit board 1401 with control semiconductor device 18.

In SD memory card 180 in the present embodiment, first antenna module 202's antenna terminal electrode 185 and second antenna module 204's antenna terminal electrode 198 can be connected to antenna connection terminal 2201 of mounted module 1201 simultaneously. This simplifies the fabricating process. The present invention is not limited to the above-described procedure of gluing first antenna module 202 and second antenna module 204 beforehand and then connecting antenna terminal electrodes 185, 198 to antenna connection terminal 2201 simultaneously. Instead, it is also possible to mount first antenna module 202 first, and then mount second antenna module 204.

Figure 12:
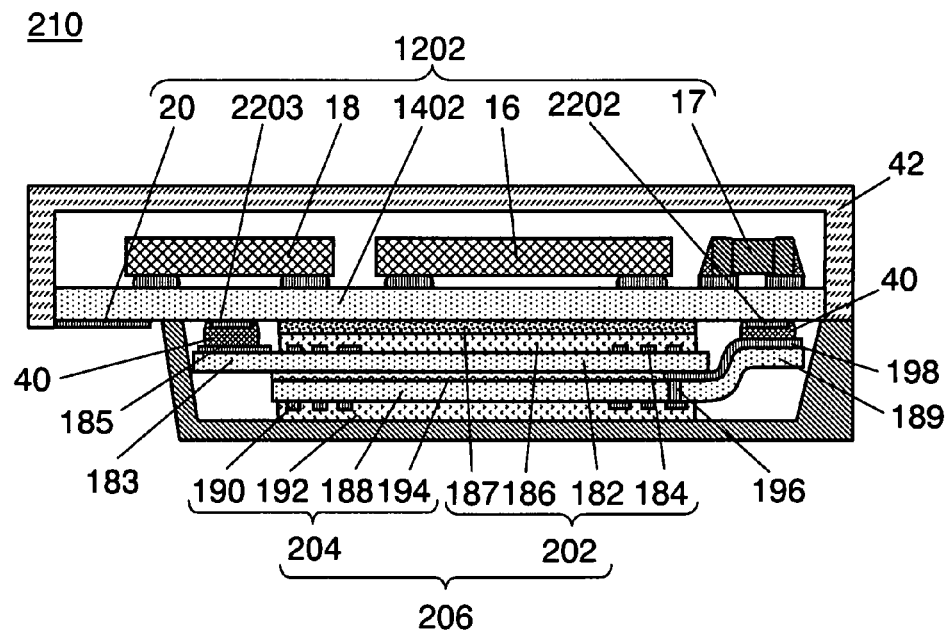
FIG. 12 is a cross sectional view used to describe the structure of a modification of SD memory card in the third embodiment.

FIG. 12 is a cross sectional view used to describe the structure of SD memory card 210, a modification of the present embodiment. SD memory card 210 features in that a place where antenna terminal electrode 185 of first antenna module 202 is connected with circuit board 1402 and a place where antenna terminal electrode 198 of second antenna module 204 is connected with circuit board 1402 are separated to the right and left. Accordingly, circuit board 1402 of mounted module 1202 is provided with antenna connection terminals 2202, 2203 disposed at the corresponding places. In the present structure, first antenna module 202 is affixed first to circuit board 1402 to have antenna terminal electrode 185 connected with antenna connection terminal 2203. Next, second antenna module 204 is affixed to first antenna module 202 to be glued by gluing layer 194. And then, bend extension 189 to connect antenna terminal electrode 198 with antenna connection terminal 2202. SD memory card 210, a modification, is thus fabricated.

Also in the present case, whether to connect first antenna 184 and second antenna 190 in series or in parallel can be determined freely by changing the design of a circuit electrode accordingly, which circuit electrode is connecting antenna connection terminals 2202, 2203 of circuit board 1402 with control semiconductor device 18.

Fourth Exemplary Embodiment

Figure 13:
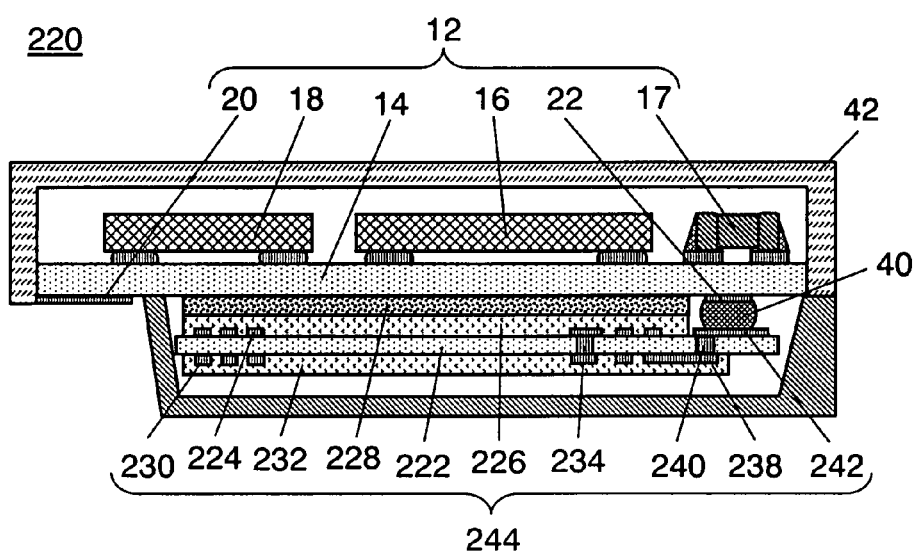
FIG. 13 is a cross sectional view used to describe the structure of an SD memory card in a fourth exemplary embodiment of the present invention.

FIG. 13 is a cross sectional view used to describe the structure of SD memory card 220 in a fourth exemplary embodiment of the present invention. SD memory card 220 is featured in the structure of antenna module 244. Namely, antenna module 244 of SD memory card 220 includes first loop antenna 224 formed on one of the surfaces of sheet board 222, insulating protection layer 226 formed on first antenna 224, layer 228 of magnetic substance formed on insulating protection layer 226, and second loop antenna 230 formed on the other surface and insulating protection layer 232 for protecting the second loop antenna.

One end of first antenna 224 is connected with an antenna terminal electrode (not shown), while the other end is connected with other end of second antenna 230 by means of via electrode 234. One end of second antenna 230 is connected with antenna terminal electrode 242 by way of connection electrode 238 and via electrode 240. Namely, in SD memory card 220 of the present embodiment, first antenna 224 and second antenna 230 are connected in series in antenna module 244.

SD memory card 220 in the present embodiment is completed when the above-configured antenna module 244's antenna terminal electrode 242 is connected to antenna connection terminal 22 of circuit board 14 by conductive glue 40, for example. Mounted module 12 may have the same structure as that of SD memory card 10 in the first embodiment.

Although first antenna 224 and second antenna 230 in the present embodiment have been connected in series and then connected to antenna connection terminal 22, these antennas can be connected instead in parallel. Furthermore, antenna connection terminal electrode may be provided individually for each of first antenna 224 and second antenna 230 formed on the respective surfaces. By so structuring, number of antenna connection terminal electrodes in antenna module 244 increases to four, but the antennas can be connected either in series or in parallel by changing the design of a circuit pattern at the circuit board 14 side accordingly.

The structure of antenna module 244 in SD memory card 220 in the present embodiment is that a single sheet board 222 is provided with first antenna 224 and second antenna 230 formed on respective surfaces. This will provide a further possibility to the thickness reduction.

Fifth Exemplary Embodiment

Figure 14:
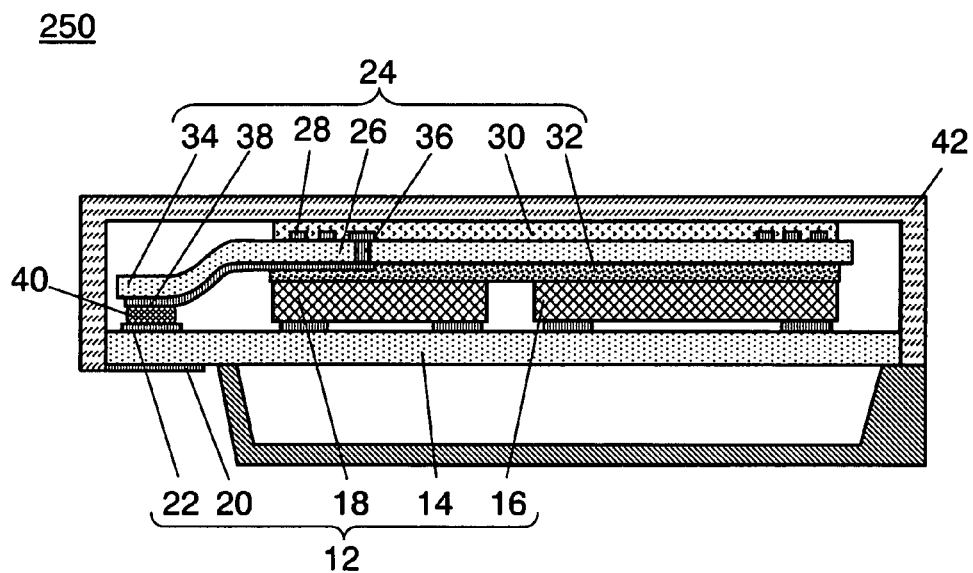
FIG. 14 is a cross sectional view used to describe the structure of an SD memory card in a fifth exemplary embodiment of the present invention.

FIG. 14 is a cross sectional view used to describe the structure of SD memory card 250 in a fifth exemplary embodiment of the present invention. SD memory card 250 uses mounted module 12 and antenna module 24 of SD memory card 10 in the first embodiment. In SD memory card 250, however, antenna module 24 is disposed overlaid on semiconductor memory device 16 and control semiconductor device 18 of mounted module 12. Accordingly, location of antenna connection terminal 22 on circuit board 14 has been changed to the connection terminal 20 side. When antenna connection terminal 22 is connected with antenna terminal electrode 38 of antenna module 24, SD memory card 250 in the present embodiment is completed. The rest part of the structure remains the same as that of SD memory card 10, so description on which part is eliminated.

Figure 15:
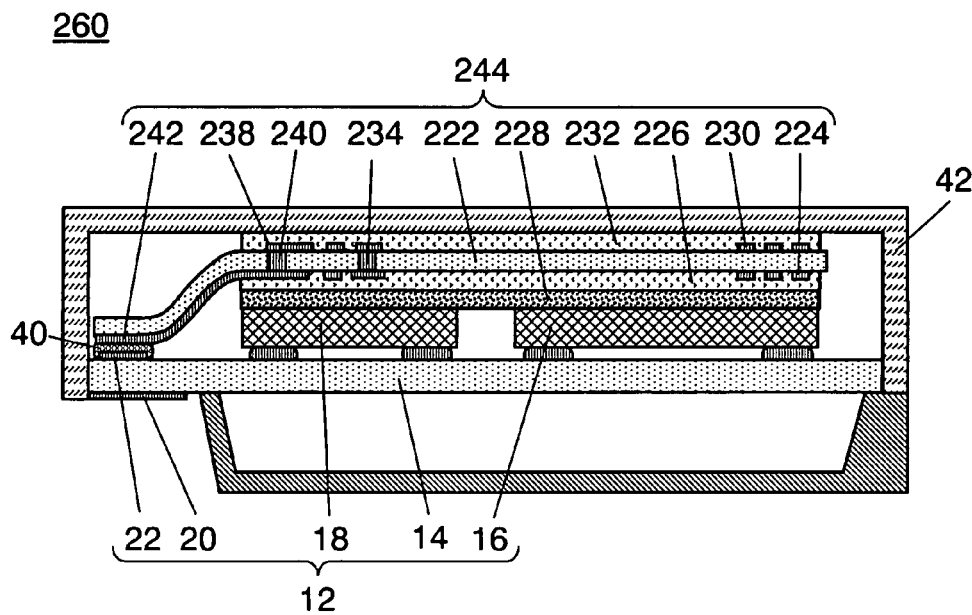
FIG. 15 is a cross sectional view used to describe the structure of a first modification of SD memory card in the fifth embodiment.

FIG. 15 is a cross sectional view used to describe the structure of SD memory card 260, a first modification of the present embodiment. SD memory card 260 uses mounted module 12 and antenna module 244 of SD memory card 220 in the fourth embodiment. Antenna module 244 in SD memory card 260, however, is disposed overlaid on semiconductor memory device 16 and control semiconductor device 18 of mounted module 12. Accordingly, location of antenna connection terminal 22 on circuit board 14 has been changed to the connection terminal 20 side. When antenna connection terminal 22 is connected with antenna terminal electrode 242 of antenna module 244, SD memory card 260 in the first modification is completed. The rest part of the structure remains the same as that of SD memory card 220, so description on which part is eliminated.

FIG. 16 is a cross sectional view used to describe the structure of a second modification of the present embodiment, SD memory card 280. SD memory card 280 uses mounted module 1202 and antenna module 206 of SD memory card 210 in the third embodiment. However, antenna module 206 in SD memory card 280, or second modification, is overlaid on semiconductor memory device 16 and control semiconductor device 18 of mounted module 1202. After extension 183 of first antenna module 202 was bent, antenna terminal electrode 185 and antenna connection terminal 2202 are connected. After extension 189 of second antenna module 204 was bent, antenna terminal electrode 198 and antenna connection terminal 2203 are connected. SD memory card 280, or the second modification, is thus fabricated. The rest part of the structure remains the same as that of SD memory card 210, so description on which part is eliminated. Mounted module 1202 is provided with capacitor 17, however the capacitor is not shown in the drawing.

In SD memory card 280, or the second modification, whether first antenna 184 and second antenna 190 are connected in series or in parallel can be determined freely by changing the design of a circuit electrode accordingly, which circuit electrode is connecting antenna connection terminals 2202, 2203 of circuit board 1402 with control semiconductor device 18.

Sixth Exemplary Embodiment

FIG. 17 is a cross sectional view used to describe the structure of SD memory card 300 in a sixth exemplary embodiment of the present invention. Mounted module 320 in SD memory card 300 has an expanded memory capacity, which is realized by a structure where sub-boards 304 having auxiliary circuit boards 306 mounted on both surfaces with semiconductor memory devices 308 are laminated on one of the surfaces of circuit board 302.

Structure of mounted module 320 is further detailed in the following. FIG. 18 is a cross sectional view showing the structure of sub-board 304. Auxiliary circuit board 306 is mounted with semiconductor memory devices 308 mounted on both surfaces. The connection between electrode terminal (not shown) of semiconductor memory device 308 and electrode terminal (not shown) of auxiliary circuit board 306 can be made with a known technology; such as soldering, gluing by conductive glue, connection by means of anisotropic conductive resin, etc. In order to make total thickness of sub-board 304 as thin as possible, it is preferred to make thickness of auxiliary circuit board 306 the thinnest possible and to use bare-chip semiconductor memory devices 308. It is preferred to polish it for thinning further.

The sub-board 304 to sub-board 304 connection and the sub-board 304 to circuit board 302 connection can be made with a gold ball, solder ball, conductive resin ball or the like conductive connector 312. Since one of the surfaces of circuit board 302 is mounted with sub-board 304, control semiconductor device 310 is mounted on the other surface of circuit board 302.

Antenna module 24 exemplified in the present embodiment is the same one as used in SD memory card 10 of the first embodiment. Bend extension 34 of antenna module 24 to have antenna terminal electrode 38 and antenna connection terminal 316 connected with conductive glue 40, for example. SD memory card 300 in the present embodiment is thus fabricated.

Thanks to the above-described structure, SD memory card 300 in the present embodiment is provided with a large memory capacity, and can exchange information through a non-contact system to and from an external apparatus. Thus the present invention offers a memory card that can be used in a still wider field of application.

Figure 19:
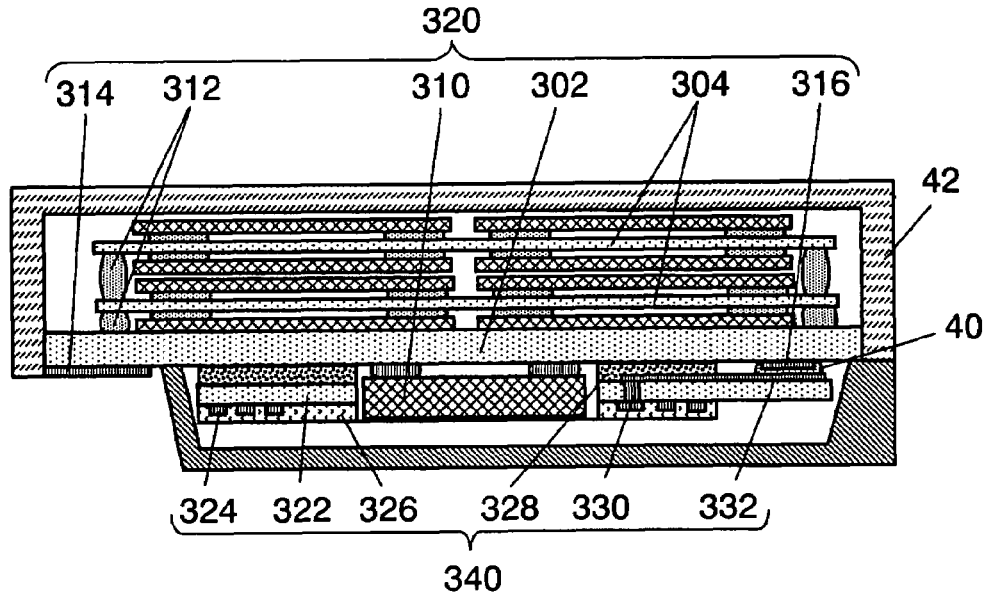
FIG. 19 is a cross sectional view used to describe the structure of a modification of SD memory card in the sixth embodiment.

FIG. 19 is a cross sectional view used to describe the structure of SD memory card 350, a modification of the present embodiment. Antenna module 340 of SD memory card 350 is disposed in a circumferential region surrounding control semiconductor device 310 of SD memory card 300 which is shown in FIG. 17.

Figure 20:
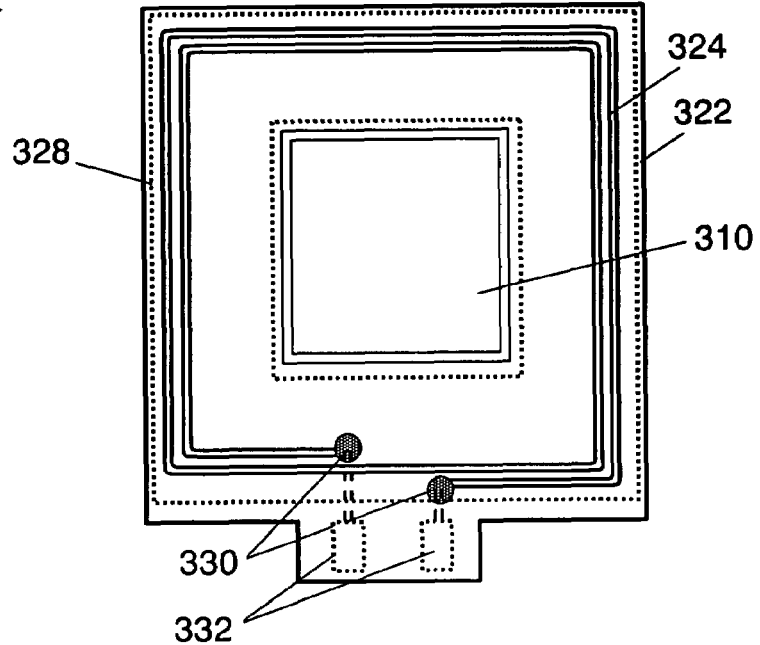
FIG. 20 is a typified plan view showing a modification of SD memory card of FIG. 19, as viewed from the control semiconductor device side.

FIG. 20 is a typified plan view of SD memory card 350 of FIG. 19, as seen from the control semiconductor device 310 side. In the drawing, outer case 42 and insulating protection layer 326 formed on the surface of antenna 324 provided on sheet board 322 of antenna module 340 are not shown for the sake of easier understanding. Antenna module 340 has an opening of large size that can accept control semiconductor device 310, and the control semiconductor device is housed in the opening. Respective ends of antenna 324 are brought, by way of via electrodes 330, to the surface at which layer 328 of magnetic substance is formed, and connected there to antenna terminal electrodes 332 through circuit electrodes. Layer 328 of magnetic substance is formed over the region containing antenna 324, with the area of the opening excluded.

If the thickness of antenna module 340 in SD memory card 350, a modification, is made to be substantially identical to that of control semiconductor device 310, the surrounding region can be made use of efficiently and antenna module 340 can be housed without causing the overall thickness to increase. Thus the memory capacity can be further increased, and information transfer to an external apparatus is made available through the non-contact system. Since both of SD memory card 300 in the present embodiment and a modification, SD memory card 350, are provided with connection terminal 314, these memory cards can transfer information through a connection by contact either.

Furthermore, like in the second embodiment, a laminated antenna module of first and second antenna modules may be used instead also in the present SD memory card in accordance with the present embodiment.

Furthermore, although semiconductor memory devices have been mounted solely on auxiliary circuit board in the present embodiment, semiconductor memory devices may be mounted on circuit board, and a sub-board may be laminated further on the surface of the mounted semiconductor memory devices.

Seventh Exemplary Embodiment

Figure 21:
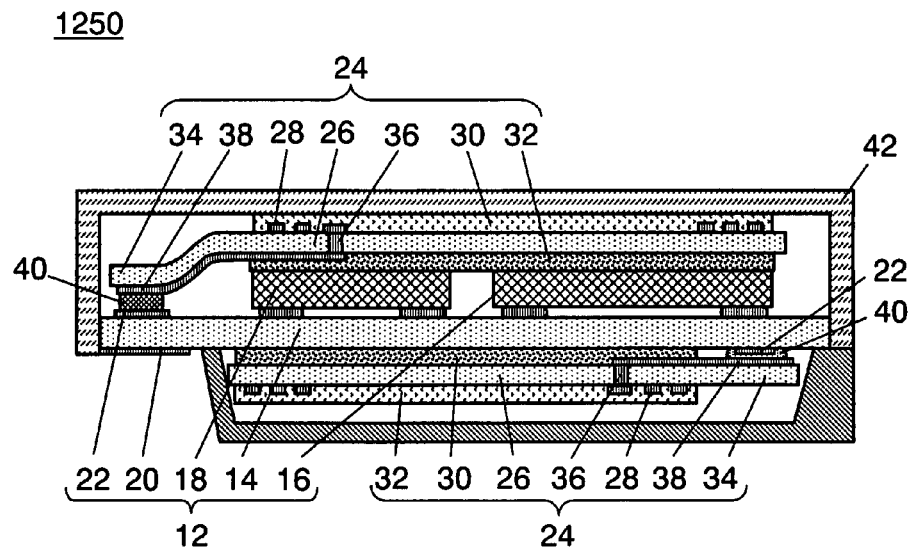
FIG. 21 is a cross sectional view used to describe the structure of an SD memory card in a seventh exemplary embodiment of the present invention.

FIG. 21 is a cross sectional view used to describe the structure of SD memory card 1250, a seventh exemplary embodiment of the present invention. SD memory card 1250 is structured in the same manner as SD memory card 250 of the fifth embodiment, further provided with another antenna module 24 laminated on the other surface of circuit board 14. So, circuit board 14 is provided with antenna connection terminal 22 at the connection terminal 20 side and another antenna connection terminal 22 at the opposite end on the other surface. When antenna terminal electrode 38 of respective antenna modules 24 is connected with antenna connection terminal 22, SD memory card 1250 in the present embodiment is fabricated. The rest part of the structure remains the same as that of SD memory card 250; so, description on which part is eliminated.

Eight Exemplary Embodiment

Figure 22:
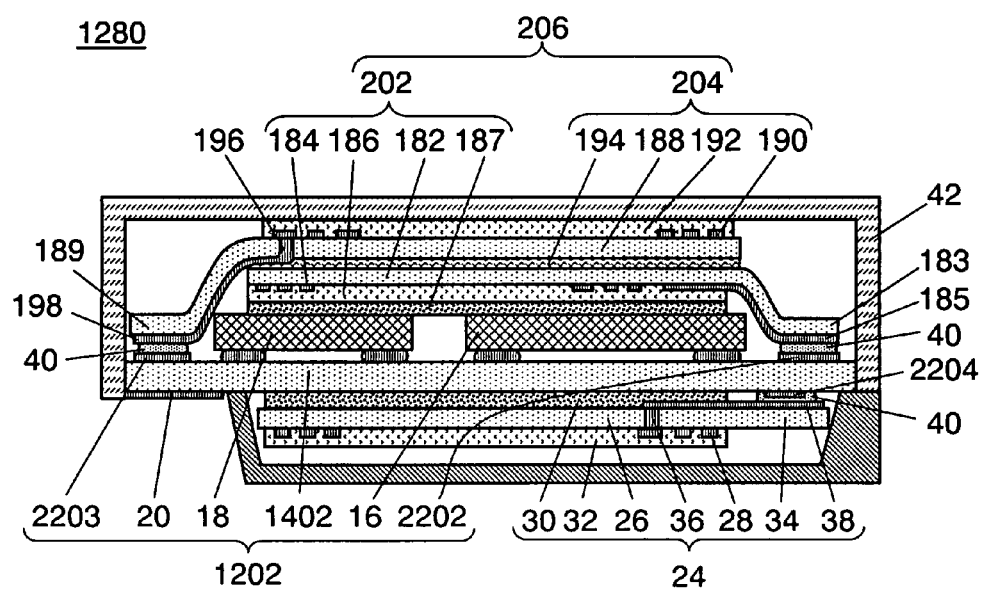
FIG. 22 is a cross sectional view used to describe the structure of an SD memory card in an eighth exemplary embodiment of the present invention.
Figure 23:
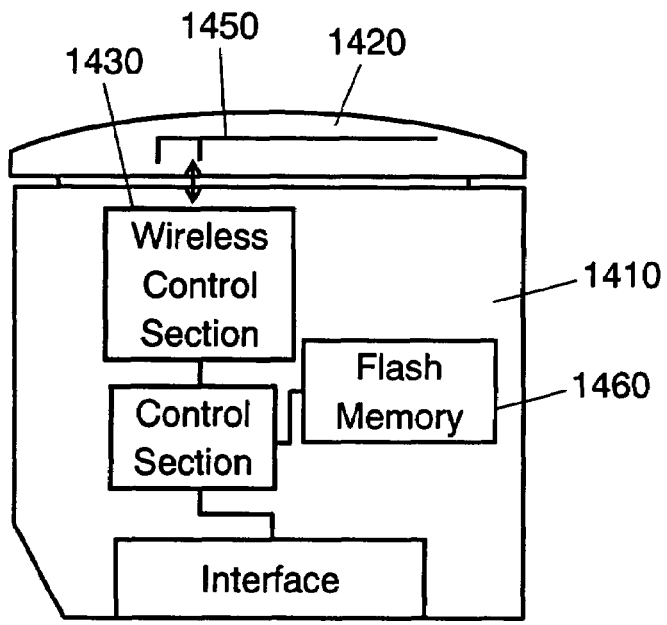
FIG. 23 shows the structure of a first conventional SD memory card.
Figure 24:
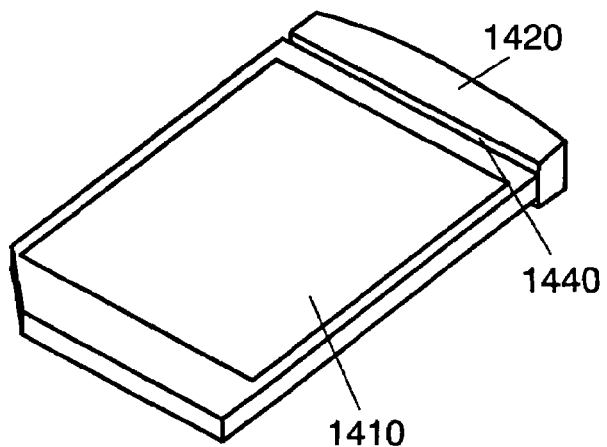
FIG. 24 is a perspective view showing the appearance of the conventional SD memory card.

FIG. 22 is a cross sectional view used to describe the structure of SD memory card 1280, an eighth exemplary embodiment of the present invention. SD memory card 1280 is structured in the same manner as SD memory card 280, the second modification of fifth embodiment, further provided with antenna module 24 laminated on the other surface of circuit board 1402. So, circuit board 1402 is provided, in addition to antenna connection terminals 2202, 2203 provided on one of the surfaces, with antenna connection terminal 2204 at the opposite end on the other surface. When antenna terminal electrode 38 of antenna module 24 is connected with antenna connection terminal 2204, SD memory card 1280 in the present embodiment is fabricated. The rest part of the structure remains the same as that of SD memory card 280; so, description on which part is eliminated.

Antenna module 24 remains the same as that of SD memory card 10 described in the first embodiment. Also in the present case, whether connecting first antenna 184 and second antenna 190 in series or in parallel can be determined freely by changing the design of a circuit electrode accordingly, which circuit electrode is connecting antenna connection terminals 2202, 2203 of circuit board 1402 with control semiconductor device 18.

Furthermore, if antenna module 206 disposed on the surface at which semiconductor memory device 16 and control semiconductor device 18 are mounted is connected in parallel with antenna module 24 disposed on the other surface, the transmitting/receiving operation to and from an external apparatus can be performed without fail regardless of the external apparatus whether it is facing to the one surface or to the other surface. Meanwhile, since mounted module 1202 is provided on the surfaces with layers 30, 187 of magnetic substance respectively, the influence of electromagnetic waves can be prevented effectively.

In the first through eighth embodiments, SD memory card was described as an example of the semiconductor memory module having built-in antenna. The present invention, however, is not limited to SD memory cards; the present invention is applicable also to those other memory modules having different structures.

The examples in the first through eighth embodiments have been provided with an insulating protection layer for protecting the antenna. An insulating layer of magnetic substance may be provided instead, and have it work also as protection layer. Furthermore, although a layer of magnetic substance has been formed on the surface of insulating protection layer, the layer of magnetic substance may be provided instead direct on a sheet board.

INDUSTRIAL APPLICABILITY

A semiconductor memory module having built-in antenna in accordance with the present invention has the information communicating capability by non-contact system, besides the conventional method of connection by contact. Further, it is so compact that it can be housed in a device whose dimensional specifications have been established, for example, an SD memory card. So, it is expected that the semiconductor memory module having built-in antenna will develop new fields of application, for use in digital still cameras, portable music players, portable information terminals and the like portable digital apparatus.

The invention claimed is:

1. A semiconductor memory module having built-in antenna comprising
   a mounted module which includes a circuit board having a connection terminal coupled with a control semiconductor device and which is exposed from the surface of an outer case, an antenna connection terminal electrode coupled with the control semiconductor device and disposed in the inside of the outer case, and a semiconductor memory device and the control semiconductor device mounted on the circuit board; and
   an antenna module which includes an antenna of loop shape formed on one of the surfaces of a resin sheet board in the neighborhood of the edge along the sides, a layer of magnetic substance formed on the one or the other surface, and an antenna terminal electrode formed on the one or the other surface; wherein
   the antenna module is overlaid on the mounted module with the layer of magnetic substance in between, and the antenna connection terminal electrode and the antenna terminal electrode are connected.

2. The semiconductor memory module having built-in antenna according to claim 1, wherein the semiconductor memory device and the control semiconductor device are mounted on one of the surfaces of said circuit board.

3. The semiconductor memory module having built-in antenna according to claim 1, wherein the semiconductor memory device is mounted on a first surface of the circuit board and the control semiconductor device is mounted on a second surface of the circuit board.

4. The semiconductor memory module having built-in antenna according to claim 3, wherein the semiconductor memory device is laminated on one of the surfaces of the circuit board.

5. The semiconductor memory module having built-in antenna according to claim 4, wherein the mounted module includes a sub-board mounted with the semiconductor memory device, said sub-board being laminated on the circuit board.

6. The semiconductor memory module having built-in antenna according to claim 1, wherein the antenna module includes a loop antenna formed on both surfaces of the sheet board, coupled by way of a via electrode provided in the sheet board with an antenna connection terminal electrode formed on the one or the other surface, and the layer of magnetic substance formed on the loop antenna disposed on the one or the other surface.

7. The semiconductor memory module having built-in antenna according to claim 3, wherein the antenna module includes said sheet board, having the loop antenna and the layer of magnetic substance, provided with an opening that is larger than the size of the control semiconductor device, wherein
   the antenna module is overlaid on the circuit board of the mounted module in a manner that the control semiconductor device fits in the opening.

8. The semiconductor memory module having built-in antenna according to claim 1, wherein the antenna module is formed by laminating a first antenna module having a first antenna of loop shape disposed on one of the surfaces of a first sheet board and a second antenna module having a second antenna of loop shape disposed on one of the surfaces of second sheet board, and the layer of magnetic substance is disposed on the first sheet board or the second sheet board.

9. The semiconductor memory module having built-in antenna according to claim 8, wherein
a common antenna terminal electrode coupled with the first antenna terminal electrode of first antenna module and the second antenna terminal electrode of second antenna module is connected with the antenna connection terminal electrode of the mounted module.

10. The semiconductor memory module having built-in antenna according to claim 8, wherein the first antenna terminal electrode of first antenna module and the second antenna terminal electrode of second antenna module are connected individually with the antenna connection terminal electrode of mounted module.

11. The semiconductor memory module having built-in antenna according to claim 1, wherein
the antenna module consists of two antennas, each of the antennas being overlaid on one of respective surfaces of the mounted module.

* * * * *

UNITED STATES PATENT AND TRADEMARK OFFICE
CERTIFICATE OF CORRECTION

| | |
|---|---|
| PATENT NO. | : 7,471,260 B2 |
| APPLICATION NO. | : 11/793301 |
| DATED | : December 30, 2008 |
| INVENTOR(S) | : Shozo Ochi et al. |

It is certified that error appears in the above-identified patent and that said Letters Patent is hereby corrected as shown below:

On the title page

In Item "(86) PCT No." change "PCT/JP2006/001732" to --PCT/JP2006/301732--.

Signed and Sealed this

Twenty-first Day of July, 2009

JOHN DOLL
*Acting Director of the United States Patent and Trademark Office*